(12) United States Patent
Brask et al.

(10) Patent No.: US 6,716,707 B1
(45) Date of Patent: Apr. 6, 2004

(54) METHOD FOR MAKING A SEMICONDUCTOR DEVICE HAVING A HIGH-K GATE DIELECTRIC

(75) Inventors: Justin K. Brask, Portland, OR (US); Timothy E. Glassman, Portland, OR (US); Mark L. Doczy, Beaverton, OR (US); Matthew V. Metz, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 33 days.

(21) Appl. No.: 10/387,303

(22) Filed: Mar. 11, 2003

(51) Int. Cl.[7] .................... H01L 21/336; H01L 21/469
(52) U.S. Cl. ...................................... 438/287; 438/785
(58) Field of Search ......................... 438/3, 197, 240, 438/287, 591, 785

(56) References Cited

U.S. PATENT DOCUMENTS

| | | | |
|---|---|---|---|
| 5,625,217 A | 4/1997 | Chau et al. | 257/412 |
| 5,783,478 A | 7/1998 | Chau et al. | 438/592 |
| 5,891,798 A | 4/1999 | Doyle et al. | 438/624 |
| 6,060,755 A * | 5/2000 | Ma et al. | 257/410 |
| 6,184,072 B1 | 2/2001 | Kaushik et al. | |
| 6,297,539 B1 * | 10/2001 | Ma et al. | 257/410 |
| 6,306,742 B1 | 10/2001 | Doyle et al. | 438/591 |
| 6,420,279 B1 * | 7/2002 | Ono et al. | 438/785 |
| 6,531,368 B1 * | 3/2003 | Yu | 438/306 |
| 6,544,906 B2 | 4/2003 | Rotondaro et al. | |
| 6,563,183 B1 * | 5/2003 | En et al. | 257/410 |
| 2003/0032303 A1 | 2/2003 | Yu et al. | |
| 2003/0045080 A1 * | 3/2003 | Visokay et al. | 438/591 |
| 2003/0064607 A1 * | 4/2003 | Leu et al. | 438/780 |

OTHER PUBLICATIONS

Doug Bariage et al., "High–Frequency Response of 100nm Integrated CMOS Transistors with High–K Gate Dielectrics", 2001 IEEE, 4 pages.

Robert Chau et al., A 50nm Depleted–Substrate CMOS Transistor (DST), 2001 IEEE, 4 pages.

"A Method of Making a Semiconductor Device Having a High–K Gate Dielectric", Ser. No. 10/082,530, Filed Feb. 22, 2002.

"A Method of Making a Semiconductor Device Having a High–K Gate Dielectric", Ser. No. 10/285,915, Filed Oct. 31, 2002.

"A Method of Making a Semiconductor Device Having a High–K Gate Dielectric", Ser. No. 10/288,043, Filed Nov. 5, 2002.

"A Method for Making a Semiconductor Device Having an Ultra–Thin High–K Gate Dielectric", Ser. No. 10/315,268, Filed Dec. 10, 2002.

"A Method for Making a Semiconductor Device Having a High–K Gate Dielectric", Ser. No. 10/338,174, Filed Jan. 7, 2003.

* cited by examiner

Primary Examiner—W. David Coleman
Assistant Examiner—Brook Kebede
(74) Attorney, Agent, or Firm—Mark V. Seeley

(57) ABSTRACT

A method for making a semiconductor device is described. That method comprises forming a high-k gate dielectric layer on a substrate. After removing impurities from that layer, and increasing its oxygen content, a gate electrode is formed on the high-k gate dielectric layer.

4 Claims, 1 Drawing Sheet

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. Such a dielectric may not, however, be compatible with polysilicon—the preferred material for making the device's gate electrode.

If such a high-k film comprises an oxide, it may manifest oxygen vacancies and excess impurity levels. Oxygen vacancies may permit undesirable interaction between the high-k film and the gate electrode. When the gate electrode comprises polysilicon, such interaction may after the electrode's workfunction or cause the device to short through the dielectric. If the process for forming the high-k film uses a metal chloride precursor, residual chlorine may adversely affect the device's electrical properties.

Accordingly, there is a need for an improved process for making a semiconductor device that includes a high-k gate dielectric. There is a need for such a process for forming a very thin high-k gate dielectric that improves the interface between the high-k film and the gate electrode by minimizing oxygen vacancies in the high-k film. There is a need for a process for forming a high-k gate dielectric with acceptable impurity levels. The method of the present invention provides such a process.

DETAILED DESCRIPTION OF THE PRESENT INVENTION

A method for making a semiconductor device is described. That method comprises forming on a substrate a high-k gate dielectric layer, then removing impurities from the high-k gate dielectric layer, and increasing the oxygen content of the high-k gate dielectric layer. A gate electrode is then formed on the high-k gate dielectric layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
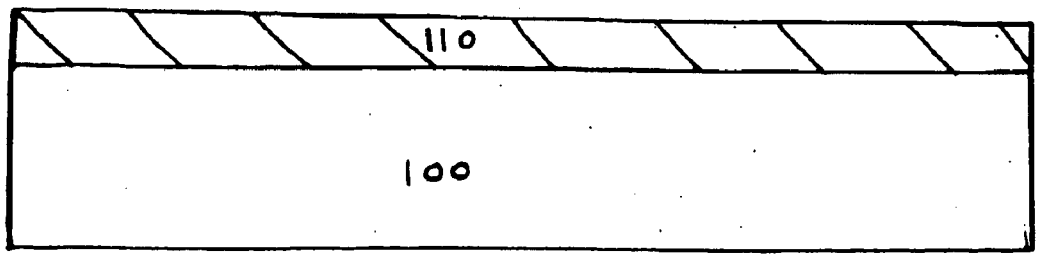
FIGS. 1a–1c represent cross-sections of structures that may be formed when carrying out an embodiment of the method of the present invention. Features shown in these figures are not intended to be drawn to scale.

In an embodiment of the method of the present invention, high-k gate dielectric layer 110 is formed on substrate 100, as shown in FIG. 1a. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although several examples of materials from which substrate 100 may be formed are described here, any material that may serve as a foundation upon which a semiconductor device may be built falls within the spirit and scope of the present invention.

When substrate 100 comprises a silicon wafer, the wafer may be cleaned before forming high-k gate dielectric layer 110 on its surface. To clean the wafer, it may initially be exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants.

After that cleaning treatment, high-k gate dielectric layer 110 may be formed on substrate 100, generating the FIG. 1a structure. High-k gate dielectric layer 110 comprises a material with a dielectric constant that is greater than the dielectric constant of silicon dioxide. Dielectric layer 110 preferably has a dielectric constant that is at least about twice that of silicon dioxide, i.e., a dielectric constant that is greater than about 8. Materials that may be used to make high-k gate dielectrics include: hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 110 are described here, that layer may be made from other materials that serve to reduce gate leakage.

High-k gate dielectric layer 110 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 110. The CVD reactor should be operated long enough to form a layer with the desired thickness. In most applications, dielectric layer 110 should be less than about 60 angstroms thick, and more preferably between about 5 angstroms and about 40 angstroms thick.

As deposited, high-k gate dielectric layer 110 may be incompatible with polysilicon due to the presence of unacceptable numbers of oxygen vacancies and excess impurity levels. For example, when a metal chloride precursor is used to form high-k gate dielectric layer 110, chlorine may permeate through that layer. A transistor with a high-k gate dielectric layer that includes a significant amount of chlorine may exhibit inferior electrical properties. In the method of the present invention, impurities are removed from high-k gate dielectric layer 110 and that layer's oxygen content is increased, after it is formed on substrate 100. After removing impurities and increasing the oxygen content, the resulting high-k gate dielectric layer 110 may be compatible with polysilicon, or other materials that may be used to form the gate electrode.

In an embodiment of the present invention, a wet chemical treatment is applied to high-k gate dielectric layer 110 to remove impurities from that layer and to increase that layer's oxygen content. The wet chemical treatment may comprise exposing high-k gate dielectric layer 110 to a solution that comprises a source of hydroxide at a sufficient temperature for a sufficient time to remove impurities from high-k gate dielectric layer 110 and to increase the oxygen content of high-k gate dielectric layer 110. That solution preferably has a pH of at least about 7, and more preferably a pH of between about 11 and about 13. The source of hydroxide may comprise, for example, deionized water, hydrogen peroxide, ammonium hydroxide, and/or a tetraalkyl ammonium hydroxide, such as tetramethyl ammonium hydroxide ("TMAH"). The appropriate time and temperature at which high-k gate dielectric layer 110 is exposed may depend upon the source of hydroxide that is included in the solution, and upon the desired thickness and other properties for high-k gate dielectric layer 110.

When high-k gate dielectric layer 110 is exposed to a solution that consists essentially of deionized water, high-k gate dielectric layer 110 should be exposed to such a solution for at least about one minute at a temperature of at least about 35° C. In a particularly preferred embodiment, high-k gate dielectric layer 110 may be exposed to such a solution for about 20 minutes at a temperature of about 40° C.

When high-k gate dielectric layer 110 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 110 is exposed to an aqueous solution that contains about 6.7% $H_2O_2$ by volume for about 10 minutes at a temperature of about 25° C.

When high-k gate dielectric layer 110 is exposed to an ammonium hydroxide based solution, an aqueous solution that contains between about 2% and about 30% ammonium hydroxide by volume may be used. That exposure step should take place at between about 15° C. and about 90° C. for at least about one minute. In a particularly preferred embodiment, high-k gate dielectric layer 110 is exposed to an aqueous solution that contains about 15% $NH_4OH$ by volume for about 30 minutes at a temperature of about 25° C.

When high-k gate dielectric layer 110 is exposed to a hydrogen peroxide/ammonium hydroxide based solution, an aqueous solution that contains between about 1% and about 10% hydrogen peroxide by volume, and between about 1% and about 10% ammonium hydroxide by volume, may be used. That exposure step should take place at between about 15° C. and about 40° C. for at least about one minute. In a particularly preferred embodiment, high-k gate dielectric layer 110 is exposed to an aqueous solution that contains about 4.2% $H_2O_2$ by volume and about 4.2% $NH_4OH$ by volume for about 10 minutes at a temperature of about 25° C.

When high-k gate dielectric layer 110 is exposed to a TMAH based solution, an aqueous solution that contains between about 2% and about 30% TMAH by volume may be used. That exposure step should take place at between about 15° C. and about 90° C. for at least about one minute. In a particularly preferred embodiment, high-k gate dielectric layer 110 is exposed to an aqueous solution that contains about 25% TMAH by volume for about 2 minutes at a temperature of about 80° C.

While high-k gate dielectric layer 110 is exposed to a solution that comprises a source of hydroxide, it may be desirable to apply sonic energy at a frequency of between about 10 KHz and about 2,000 KHz, while dissipating at between about 1 and about 10 watts/cm$^2$. In a preferred embodiment, sonic energy may be applied at a frequency of about 1,000 KHz, while dissipating at about 5 watt/cm$^2$.

When the wet chemical treatment of the present invention is applied to high-k gate dielectric layer 110, the chlorine content of that layer may decrease by at least about 80 percent, and perhaps as much as 90 percent. In addition to providing a source of hydroxide, a hydrogen peroxide containing solution may act as an oxidizer. When such a solution is used, the oxygen content of layer 110 may increase by at least about 10 percent. (Other sources of hydroxide, which serve to replace impurities with hydroxyl groups, may also increase layer 110's oxygen content to some extent.)

When high-k gate dielectric layer 110 is exposed to the solutions described above, that layer may be partially etched. Using the method of the present invention to reduce the thickness of layer 110, while simultaneously increasing that layer's oxygen content and reducing its chlorine content, may be particularly advantageous when a slightly thinner layer is desired. At least about 10% of high-k gate dielectric layer 110 (and perhaps as much as 30% or more) may be partially etched, when that layer is exposed to certain of these solutions. When exposing high-k gate dielectric layer 110 to the above described solutions, a negligible amount of oxide, if any, may grow on substrate 100. In a preferred embodiment, less than about 3 angstroms of oxide, if any, will grow on substrate 100, when layer 110 is exposed to these solutions.

In the method of the present invention, a single wet chemical treatment may be applied after high-k gate dielectric layer 110 has been completed. Alternatively, an iterative approach may be applied, in which a series of deposition steps alternate with wet chemical treatment steps. In such an iterative process, a second high-k gate dielectric layer is formed after the initial wet chemical treatment, and that second high-k gate dielectric layer is exposed to a second solution that includes a source of hydroxide. A third layer may then be formed followed by a third wet chemical treatment, and so on, until the desired thickness for the high-k gate dielectric layer is achieved.

Although a few examples of wet chemical treatments that may be used to remove impurities from high-k gate dielectric layer 110, and to increase that layer's oxygen content, are described here, other treatments that serve to modify high-k gate dielectric layer 110 in that way may be used instead, as will be apparent to those skilled in the art. Examples include exposing high-k gate dielectric layer 110 to aqueous solutions that contain ozone, or to other solutions that contain other types of oxidizing and/or hydrolyzing agents.

Figure 1B:
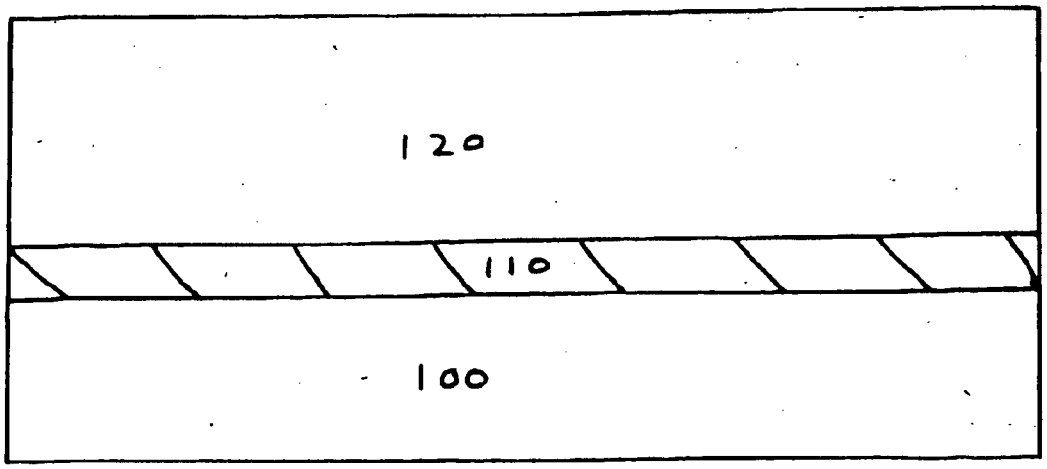
Figure 1C:
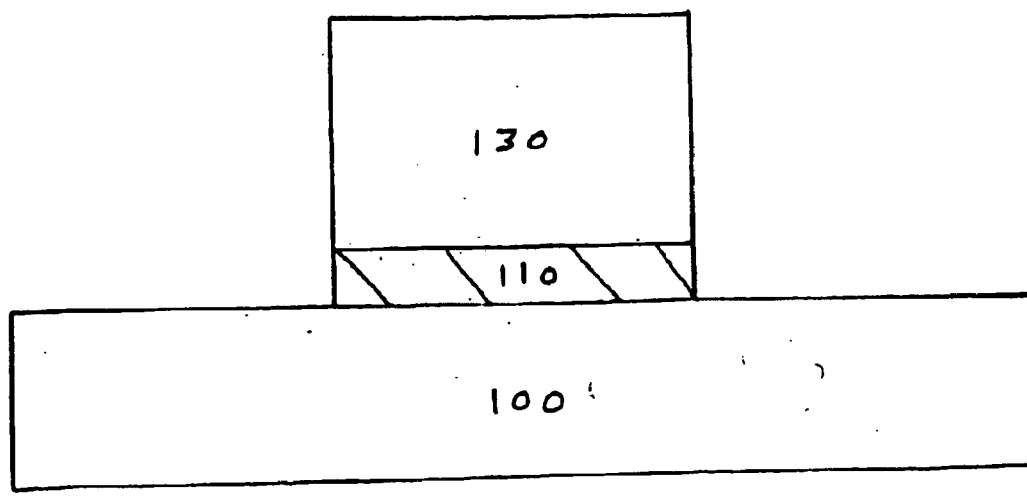

After removing impurities from high-k gate dielectric layer 110, and increasing that layer's oxygen content, a gate electrode is formed on layer 110. In a preferred embodiment, the gate electrode may be formed by initially depositing polysilicon layer 120 on high-k gate dielectric layer 110— generating the FIG. 1*b* structure. Polysilicon layer 120 may be deposited using conventional methods and preferably is between about 500 angstroms and about 4,000 angstroms thick. After etching both layers 120 and 110 to form the FIG. 1*c* structure, using conventional techniques, additional steps that are generally used to complete the gate electrode (e.g., forming a silicide (not shown) on the upper part of etched polysilicon structure 130) may be applied. As such steps are well known to those skilled in the art, they will not be described in more detail here. Although the gate electrode preferably comprises polysilicon, it may alternatively be formed from various metals with which the above described high-k gate dielectrics may be used.

The method of the present invention may enable a high-k gate dielectric to be used with a polysilicon-based gate electrode. By removing impurities from high-k gate dielectric layer 110 and increasing that layer's oxygen content, the dielectric layer's surface and electrical properties may be enhanced, which may render it suitable for use with polysilicon and other gate electrode materials.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
    forming a high-k gate dielectric layer on a substrate, the high-k gate dielectric layer comprising impurities and oxygen;
    exposing the high-k gate dielectric layer to a solution that comprises tetramethyl ammonium hydroxide at a sufficient temperature for a sufficient time to remove impurities from the high-k gate dielectric layer and to increase the oxygen content of the high-k gate dielectric layer; and then
    forming a gate electrode on the high-k gate dielectric layer.

2. The method of claim 1 wherein the gate electrode comprises polysilicon.

3. A method for making a semiconductor device comprising:
    forming a high-k gate dielectric layer on a substrate by atomic layer chemical vapor deposition, the high-k gate dielectric layer being between about 5 angstroms and about 40 angstroms thick, and comprising chlorine, oxygen, and a material selected from the group consisting of hafnium oxide, zirconium oxide, titanium oxide, and aluminum oxide;
    exposing the high-k gate dielectric layer to a solution that comprises tetramethyl ammonium hydroxide at a temperature that is between about 15° C. and about 90° C. for at least about one minute to remove chlorine from the high-k gate dielectric layer and to increase the oxygen content of the high-k gate dielectric layer;
    forming a layer that comprises polysilicon on the high-k gate dielectric layer; and
    etching the polysilicon containing layer and the high-k gate dielectric layer.

4. A method for making a semiconductor device comprising:
    forming a first high-k gate dielectric layer on a substrate by atomic layer chemical vapor deposition, the first high-k dielectric layer being between about 5 angstroms and about 40 angstroms thick, and composing chlorine, oxygen, and a material selected from the group consisting of hafnium oxide, zirconium oxide, titanium oxide, and aluminum oxide;
    exposing the first high-k gate dielectric layer to a solution that comprises a source of hydroxide that is selected from the group consisting of deionized water, hydrogen peroxide, ammonium hydroxide, and a tetraalkyl ammonium hydroxide, at a sufficient temperature for a sufficient time to remove chlorine from the first high-k gate dielectric layer and to increase the oxygen content of the high-k gate dielectric layer;
    forming a second high-k gate dielectric layer on the first high-k gate dielectric layer, and exposing the second high-k gate dielectric layer to a second solution that includes a source of hydroxide;
    forming a layer that comprises polysillicon on the second high-k dielectric layer; and
    etching the polysilicon containing layer, the first high-k gate dielectric layer, and the second high-k gate dielectric layer.

* * * * *